United States Patent
Kim et al.

(10) Patent No.: US 9,773,972 B1
(45) Date of Patent: Sep. 26, 2017

(54) MAGNETIC DEVICE

(71) Applicants: Ki-woong Kim, Hwaseong-si (KR);
Kee-won Kim, Suwon-si (KR);
Se-chung Oh, Yongin-si (KR);
Yong-sung Park, Suwon-si (KR);
Ju-hyun Kim, Hwaseong-si (KR)

(72) Inventors: Ki-woong Kim, Hwaseong-si (KR);
Kee-won Kim, Suwon-si (KR);
Se-chung Oh, Yongin-si (KR);
Yong-sung Park, Suwon-si (KR);
Ju-hyun Kim, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/420,091

(22) Filed: Jan. 30, 2017

(30) Foreign Application Priority Data

Jul. 12, 2016 (KR) .......................... 10-2016-0088052

(51) Int. Cl.
| | |
|---|---|
| *H01L 29/82* | (2006.01) |
| *H01L 43/10* | (2006.01) |
| *H01L 43/02* | (2006.01) |
| *H01L 27/22* | (2006.01) |
| *H01L 43/12* | (2006.01) |

(52) U.S. Cl.
CPC ............ *H01L 43/10* (2013.01); *H01L 27/222* (2013.01); *H01L 43/02* (2013.01); *H01L 43/12* (2013.01)

(58) Field of Classification Search
CPC ......... H01L 43/10; H01L 43/02; H01L 43/12; H01L 27/222
USPC ........................................................ 257/421
See application file for complete search history.

(56) References Cited

U.S. PATENT DOCUMENTS

| | | | |
|---|---|---|---|
| 6,838,740 B2 | 1/2005 | Huai et al. | |
| 6,847,510 B2 | 1/2005 | Childress et al. | |
| 7,466,526 B2 | 12/2008 | Sato et al. | |
| 7,522,388 B2* | 4/2009 | Miyazawa | B82Y 25/00 360/324 |
| 7,576,956 B2 | 8/2009 | Huai | |
| 8,817,426 B2 | 8/2014 | Gao et al. | |
| 9,053,719 B2 | 6/2015 | Yang et al. | |
| 9,281,466 B2 | 3/2016 | Sandhu et al. | |
| 2013/0249025 A1 | 9/2013 | Natori et al. | |

FOREIGN PATENT DOCUMENTS

JP          2010093157 A          4/2010

* cited by examiner

*Primary Examiner* — Tu-Tu Ho
(74) *Attorney, Agent, or Firm* — Renaissance IP Law Group LLP

(57) ABSTRACT

A magnetic device includes a free layer; a pinned layer; a tunnel barrier disposed between the free layer and the pinned layer; a polarization enhancement layer disposed between the tunnel barrier and the pinned layer; and a blocking layer disposed between the polarization enhancement layer and the pinned layer, wherein the blocking layer includes a first diffusion trap layer and a second diffusion trap layer disposed on the first diffusion trap layer.

20 Claims, 14 Drawing Sheets

MAGNETIC DEVICE

CROSS-REFERENCE TO RELATED APPLICATIONS

This application claims the benefit of Korean Patent Application No. 10-2016-0088052, filed on Jul. 12, 2016, in the Korean Intellectual Property Office, the disclosure of which is incorporated herein in its entirety by reference.

BACKGROUND

The inventive concept relates to a magnetic device, and more particularly, to a magnetic device that includes a magnetic tunnel junction (MTJ) having a perpendicular magnetic anisotropy (PMA).

Much research has been conducted into electronic devices that use a magnetic resistance property of a magnetic tunnel junction (MTJ). In particular, since a highly integrated magnetic random access memory (MRAM) device has a finely sized MTJ cell, a spin transfer torque (STT)-MRAM has been spotlighted because current is directly applied to the MTJ cell, which induces a magnetization inversion and stores information by a physical phenomenon of STT. A highly integrated STT-MRAM device provides fast switching and a low-current operation, yet needs to have a sufficient level of perpendicular magnetic anisotropy (PMA) in a magnetic layer that includes the MTJ structure.

SUMMARY

The inventive concept provides a magnetic device that may maintain a stable perpendicular magnetic anisotropy (PMA) at a high temperature based on an excellent heat-resistance characteristic, may perform a low-current operation read and write operation, and may secure a high tunneling magnetoresistance ratio (TMR).

According to an aspect of the inventive concept, a magnetic device may include a free layer; a pinned layer; a tunnel barrier disposed between the free layer and the pinned layer; a polarization enhancement layer disposed between the tunnel barrier and the pinned layer; and a blocking layer disposed between the polarization enhancement layer and the pinned layer, wherein the blocking layer may include a first diffusion trap layer and a second diffusion trap layer disposed on the first diffusion trap layer.

According to another aspect of the inventive concept, a magnetic device may include: a free layer; a pinned layer; a tunnel barrier disposed between the free layer and the pinned layer; a polarization enhancement layer disposed between the tunnel barrier and the pinned layer; and a blocking layer disposed between the polarization enhancement layer and the pinned layer, wherein the blocking layer may include a mixture of a transition metal and a magnetic material.

According to an aspect of the inventive concept, a magnetic memory device may include a pinned magnetic layer having a first surface and a second surface; a blocking layer on the first surface of the pinned magnetic layer in which the blocking layer may include a first diffusion trap layer and a second diffusion trap layer disposed on the first diffusion trap layer; a polarization enhancement layer on the blocking layer; and a tunnel barrier layer on the polarization enhancement layer.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
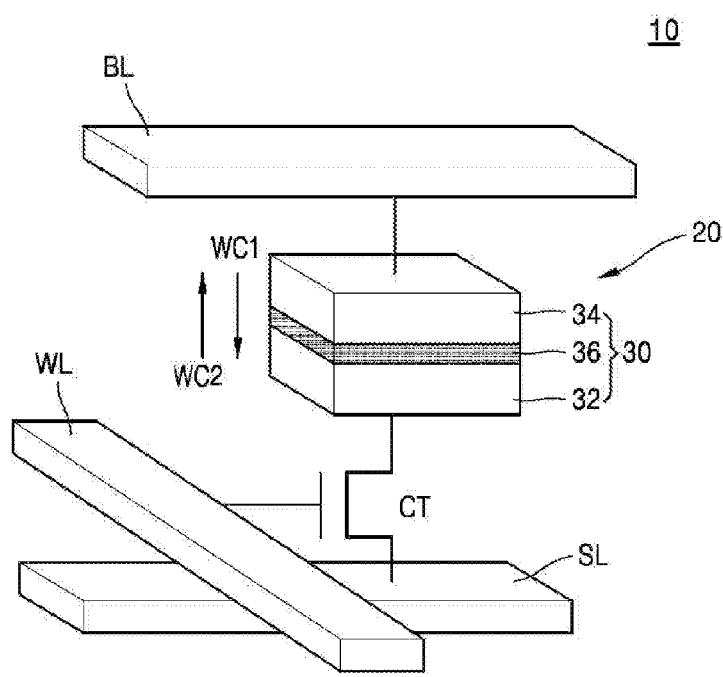
FIG. 1 depicts a schematic representation of a magnetic device according to embodiments of the inventive concept.

FIG. 1 depicts a schematic representation of a magnetic device 10 according to embodiments of the inventive concept. More specifically, FIG. 1 depicts a memory cell 20 of the magnetic device 10 that is formed as a spin transfer torque magnetoresistive random access memory (STT-MRAM) device.

The memory cell 20 may include a magnetic tunnel junction (MTJ) structure 30 and a cell transistor CT. A gate of the cell transistor CT may be connected to a word line WL. One electrode of the cell transistor CT may be connected to a bit line BL through the MTJ structure 30. Another electrode of the cell transistor CT may be connected to a source line SL.

The MTJ structure 30 may include a free layer 34, a pinned layer 32, and a tunnel barrier 36 that is disposed between the free layer 34 and the pinned layer 32. The free layer 34 may have a magnetization easy axis oriented in a direction that is perpendicular or substantially perpendicular to a direction in which the free layer 34 extends from a surface that is between the free layer 34 and the tunnel barrier layer 36, and may have a magnetization direction that is variable according to conditions. The pinned layer 32 may have a magnetization easy axis oriented in a that is direction perpendicular or substantially perpendicular to a direction in which the pinned layer 32 extends from a surface that is between the pinned layer 32 and the tunnel barrier layer 36, and may have a pinned magnetization direction.

A resistance value of the MTJ structure 30 may change depending on the magnetization direction of the free layer 34. For example, if the magnetization direction of the free layer 34 and the magnetization direction of the pinned layer 32 are parallel to each other, the MTJ structure 30 may have a low-resistance and may be considered as storing, for example, a data "0". If the magnetization direction of the free layer 34 and the magnetization direction of the pinned layer 32 are anti-parallel to each other, the MTJ structure 30 may have a high-resistance value and may be considered as storing, for example, a data "1".

The free layer 34 and/or the pinned layer 32 may include a hybrid magnetization layer 50 according to the exemplary embodiments of the inventive concept that will be described below in connection with FIGS. 2A through 2D. As used herein, the word "exemplary" means "serving as an example, instance, or illustration." Any embodiment described herein as "exemplary" is not to be construed as necessarily preferred or advantageous over other embodiments.

The positions of the free layer 34 and the pinned layer 32 with respect to the tunnel barrier layer 36 are not limited to those depicted in FIG. 1 and may be switched. That is, the free layer 34 may be positioned proximately to the cell transistor CT and the pinned layer 32 may be positioned distally from the cell transistor CT.

For the magnetic device 10 of FIG. 1, for a write operation of an STT-MRAM, the cell transistor CT may be turned on by applying a voltage to the word line WL that has a high logic level, and write currents WC1 and WC2 may be applied between the bit line BL and the source line SL. In this regard, the magnetization direction of the free layer 34 may be determined, or set, based on the directions of the write currents WC1 and WC2. The magnetization direction of the free layer 34 in the MTJ structure 30 may be changed according to an STT physical phenomenon.

In the magnetic device 10 of FIG. 1, for a read operation of the STT-MRAM, the cell transistor CT may be turned on by applying a voltage to the word line that has a high logic level, and data stored in the MTJ structure 30 may be determined, or read, by applying a read current in a direction from the bit line BL to the source line SL. In this regard, because a magnitude of the read current is much smaller than the magnitudes of the write currents WC1 and WC2, the read current may not change the magnetization direction of the free layer 34.

Figure 2A:
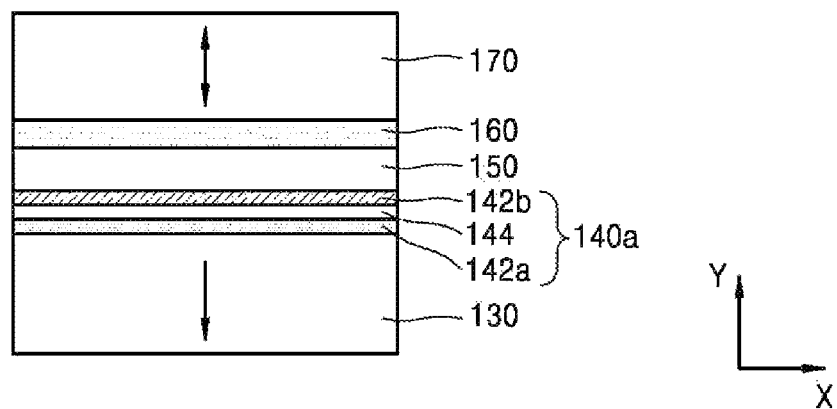
FIGS. 2A through 2D depict cross-sectional views of a magnetic junction that may be included in MTJ structure according to exemplary embodiments of the inventive concept.

FIG. 2A depicts a cross-sectional view of a magnetic junction 50a that may be included in the MTJ structure 30 of FIG. 1 according to embodiments of the inventive concept.

Referring to FIG. 2A, the magnetic junction 50a may include a pinned layer 130. The pinned layer 130 may include a magnetic material having an intrinsic perpendicular magnetization characteristic (referred to herein as a perpendicular magnetic material). In this regard, the intrinsic perpendicular magnetization characteristic means that a magnetic layer has a magnetization characteristic that is in a direction that is parallel or substantially parallel to a thickness direction of the magnetic layer if there is no external factor affecting the magnetization. For example, if a magnetic layer having a perpendicular magnetization characteristic is formed on a substrate, a magnetization direction of the magnetic layer may be perpendicular or substantially perpendicular to an upper surface of the substrate.

The intrinsic perpendicular magnetization characteristic of the pinned layer 130 may be formed by a single-layer or a multiple-layer structure that includes at least one of perpendicular magnetic material that includes cobalt. In some embodiments, the pinned layer 130 may have a single-layer or a multiple-layer structure that includes an alloy of cobalt platinum, or an alloy of cobalt platinum that includes a component X in which the component X may be boron, ruthenium, chrome, tantalum, an oxide of boron, ruthenium, chrome or tantalum, or a combination thereof. In other embodiments, the pinned layer 130 may be provided as a multilayer structure that includes cobalt-containing films and precious-metal films that are alternately and repeatedly stacked. In the case of stacked layers, the cobalt-containing films may include cobalt, cobalt iron, cobalt nickel, and/or cobalt chrome, and the precious-metal films may include platinum and/or palladium. In other embodiments, the pinned layer 130 may be provided as a multilayer structure that includes thin films according to some of the other embodiments described above.

The above-described materials are merely mentioned as examples of materials that have the above-described intrinsic perpendicular magnetization characteristic of the pinned layer 130 for a better understanding of the idea of the inventive concept. It should be understood, however, that the example embodiments of the inventive concept are not limited thereto. For example, the pinned layer 130 may be, but is not limited to, a) cobalt-iron-terbium (CoFeTb) having a content ratio of terbium (Tb) of more than 10%, b) cobalt-iron-gadolinium (CoFeGd) having a content ratio of gadolinium (Gd) of more than 10%, c) cobalt-iron-dysprosium (CoFeDy), d) FePt of an $L1_0$ structure, e) FePd of the $L1_0$ structure, CoPd of the $L1_0$ structure, g) CoPt of the $L1_0$ structure or an $L1_1$ structure, h) CoPt of a hexagonal closest packing (HCP) structure, i) alloys including at least one of the above-described materials of a) through h) and superlattice materials including the above-described materials of a) through h), and j) a structure in which magnetic layers and non-magnetic layers are alternately and repeatedly stacked. In this regard, $L1_1$ and $L1_0$ structures are named by a Strukturbericht designation. The structure in which magnetic layers and non-magnetic layers are alternately and repeatedly stacked may be a structure of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n in which n is a stack number. In exemplary embodiments, the pinned layer 130 may have a structure that is oriented along a (0001) crystalline surface of the HCP structure or a (111) crystalline surface of a face-centered cubic (FCC) structure.

A polarization enhancement layer 150 for increasing a spin polarization of the pinned layer 130 may be formed on the pinned layer 130. The polarization enhancement layer 150 may include a CoFeB magnetic layer. A magnetization direction of the polarization enhancement layer 150 may be the same as the magnetization direction of the pinned layer 130. The polarization enhancement layer 150 may have a thickness that ranges from about 10 Å to about 20 Å.

The magnetic junction 50a may further include a tunnel barrier 160 that is provided on the polarization enhancement layer 150. The tunnel barrier 160 may include an insulating material. For example, the tunnel barrier 160 may include magnesium oxide, titanium oxide, aluminum oxide, magnesium-zinc oxide, magnesium-boron oxide, or a combination thereof.

The magnetic junction 50a may further include a free layer 170 that is provided on the tunnel barrier 160. The free layer 170 may have a magnetization easy axis in a direction (i.e., the Y direction of FIG. 2A) that is perpendicular or substantially perpendicular to a direction in which the free layer 170 extends from a surface that is between the free layer 170 and the tunnel barrier 160. In some embodiments, the free layer 170 may include a single layer or a multilayer that includes a material indicated as $Co_aFe_bB_cZ_{(1-a-b-c)}$ in which Z denotes a dopant, a, b, and c denote atom ratios that are respectively $0 \leq a \leq 0.9$, $0 \leq b \leq 0.9$, and $0 \leq c \leq 0.4$, and a, b, and c are not simultaneously 0. The dopant Z of the free layer 170 may include at least one element selected from Si, Cr, Al, Ta, Hf, Zr, Ni, V, Mo, P, C, W, Nb, Mn, and Ge, or, alternatively, may be omitted. In exemplary embodiments, the free layer 170 may have a structure that is oriented along a (0001) crystalline surface of a body-centered cubic (BCC) structure.

The magnetic junction 50a may further include a blocking layer 140a that is disposed between the polarization enhancement layer 150 and the pinned layer 130. The blocking layer 140a may include a first diffusion trap layer 142a, a second diffusion trap layer 142b, and a magnetic interlayer 144 that is disposed between the first diffusion trap layer 142a and the second diffusion trap layer 142b.

At least one of the first diffusion trap layer 142a and the second diffusion trap layer 142b may include metal, alloys, metal oxides, metal nitrides, metal oxynitrides, or combination thereof. The first diffusion trap layer 142a and/or the second diffusion trap layer 142b may include a transition metal. In greater detail, the first diffusion trap layer 142a and/or the second diffusion trap layer 142b may include Mo, W, Ta, Ti, Zr, Hf, V, Nb, or alloys thereof.

A thickness of each of the first diffusion trap layer 142a and the second diffusion trap layer 142b may be less than 5 Å. If the thickness of each of the first diffusion trap layer 142a and the second diffusion trap layer 142b is extremely small, a trap capability that will be described below may be insufficient. On the other hand, if the thickness of each of the first diffusion trap layer 142a and the second diffusion trap layer 142b is significantly large, a magnetic coupling between the free layer 170, the polarization enhancement layer 150, and the pinned layer 130 may deteriorate or may be decoupled.

The first diffusion trap layer 142a and the second diffusion trap layer 142b may have different thicknesses. The first diffusion trap layer 142a and the second diffusion trap layer 142b may have different compositions. It should be understood, however, that the inventive concept is not limited thereto. That is, the first diffusion trap layer 142a and the second diffusion trap layer 142b may have the same thickness. Alternatively, the first diffusion trap layer 142a and the second diffusion trap layer 142b may have the same composition.

The magnetic interlayer 144 may include a magnetic material. The magnetic material 144 may include an amorphous magnetic material. In greater detail, the magnetic interlayer 144 may include a material indicated as $Co_aFe_b$-$Ni_cB_dZ_{(1-a-b-c-d)}$ in which Z denotes a dopant, a, b, and c denote atom ratios that are respectively $0 \leq a \leq 0.9$, $0 \leq b \leq 0.9$, $0 \leq c \leq 0.9$, and $0 \leq d \leq 0.5$, and a, b, and c are not simultaneously 0. The dopant Z may include at least one element selected from Si, Cr, Al, Ta, Hf, Zr, Ni, V, Mo, P, C, W, Nb, Mn, and Ge. A thickness of the magnetic interlayer 144 may be adjusted based on the thicknesses of the first diffusion trap layer 142a and the second diffusion trap layer 142b, and/or based on properties of the compositions of the first diffusion trap layer 142a and the second diffusion trap layer 142b. The magnetic interlayer 144 may have a thickness that ranges from about 3 Å to about 20 Å. If the thickness of the magnetic interlayer 144 is less than 3 Å, a supplementing effect of a magnetic coupling between the free layer 170, the polarization enhancement layer 150, and the pinned layer 130, which will be described below, may be insufficient, and a magnetic coupling between the free layer 170, the polarization enhancement layer 150, and the pinned layer 130 may deteriorate or may be decoupled. On the other hand, it may not be economical from a processing point of view if the thickness of the magnetic interlayer 144 is greater than about 20 Å. Additionally, if the thickness of the magnetic interlayer 144 is significantly greater than the thicknesses of the first diffusion trap layer 142a and the second diffusion trap layer 142b that includes a transition metal, the trap capability, which will be described below, may be reduced.

If it is necessary to increase a magnetoresistance ratio, an annealing process may be performed on a magnetic device. Some materials that are included in one layer may diffuse into an adjacent layer based on an annealing temperature, which may deteriorate performance of the magnetic device. In greater detail, if one layer includes only a single trapping layer, the trapping layer may prevent some materials from diffusing into an adjacent layer during a low-temperature annealing of about 350° C., whereas the trapping layer may be insufficient to prevent materials from diffusing into an adjacent layer at a temperature that is greater than about 350° C.

In exemplary embodiments of the inventive concept, the blocking layer 140a may include the first diffusion trap layer 142a and the second diffusion trap layer 142b. That is, the blocking layer 140a may include a plurality of diffusion trap layers to prevent atoms that are included in the polarization enhancement layer 150 from diffusing into the pinned layer 130 or to prevent atoms that are included in the pinned layer 130 from diffusing into the polarization enhancement layer 150 for an annealing temperature that is greater than about 350° C. For example, the blocking layer 140a may prevent a material, such as Pt, etc., that may be included in the pinned layer 130 from diffusing into the polarization enhancement layer 150 or a material, such as B, etc., that may be included in the polarization enhancement layer 150 may be prevented from diffusing into the pinned layer 130.

Materials that are included in the pinned layer 130 may increase a grain-growth tendency at a temperature that is greater than about 400° C. In this regard, transition metals, in particular, materials such as Mo, W, Ta, T, Zr, Hf, V, and Nb, or alloys thereof, may offset the grain-growth tendency. For example, the transition metals may offset the grain-growth tendency of Pt, etc. that may be included in the pinned layer 130. Additionally, when the transition metals are borided, a high thermotolerance is advantageously provided because the melting point of the pinned layer 130 increases.

Meanwhile, the blocking layer 140a, which includes the first diffusion trap layer 142a and the second diffusion trap layer 142b, may be disposed between the polarization enhancement layer 150 and the pinned layer 130, and a magnetic coupling may deteriorate or may be decoupled between the free layer 170, the polarization enhancement layer 150, and the pinned layer 130. In exemplary embodiments of inventive concept, the magnetic interlayer 144 may be provided between the first diffusion trap layer 142a and the second diffusion trap layer 142b, thereby supplementing the magnetic coupling and simultaneously preventing atoms that are included in the pinned layer 130 from diffusing into the polarization enhancement layer 150.

In particular, if the magnetic interlayer 144 includes at least one of the above-described amorphous magnetic materials, a diffusion from the pinned layer 130 to the polarization enhancement layer 150 may be reduced because a diffusion of material through an amorphous layer is more difficult than through a crystalline layer, and thus a magnetic device having a high thermotolerance may be implemented. Furthermore, the magnetic interlayer 144 may trap atoms like the first diffusion trap layer 142a and the second diffusion trap layer 142b. For example, the magnetic interlayer 144 may prevent a material, such as Pt, etc., which may be included in the pinned layer 130 from diffusing into the polarization enhancement layer 150.

The above-described effects are described for better understanding of the inventive concept and do not limit the inventive concept in any sense.

Figure 2B:
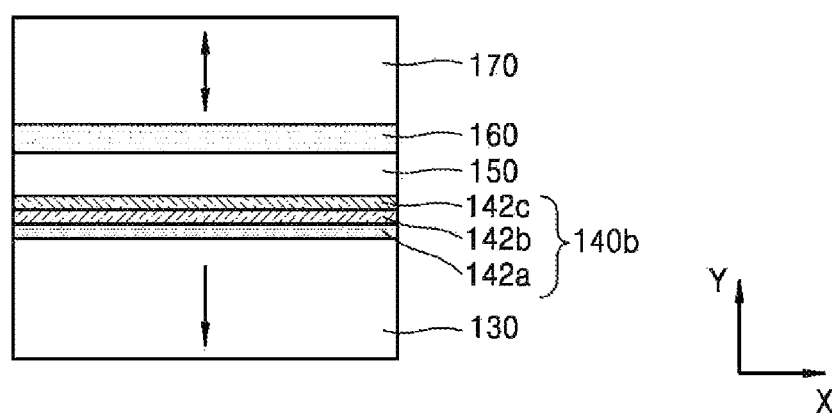

FIG. 2B depicts a cross-sectional view of a magnetic junction 50b that may be included in the MTJ structure 30 of FIG. 1.

For convenience of description, differences between FIGS. 2B and 2A will be described below.

According to exemplary embodiments, a blocking layer 140b may include the first diffusion trap layer 142a, the second diffusion trap layer 142b, and a third diffusion trap layer 142c. In this regard, at least one of the first through third diffusion trap layers 142a, 142b, and 142c may include one or more transition metals. In particular, at least one of the first through third diffusion trap layers 142a, 142b, and 142c may include one or more transition metals, such as Mo, W, Ta, Ti, Zr, Hf, V, or Nb, or alloys thereof.

A thickness of each of the first through third diffusion trap layers 142a, 142b, and 142c may be less than about 5 Å. The first through third diffusion trap layers 142a, 142b, and 142c may have different thicknesses. The first through third diffusion trap layers 142a, 142b, and 142c may have different compositions. The inventive concept, however, is not limited thereto. The first through third diffusion trap layers 142a, 142b, and 142c may have the same thickness, and/or the first through third diffusion trap layers 142a, 142b, and 142c may alternatively have the same composition.

In this regard, the blocking layer 140b includes the three diffusion trap layers 142a, 142b, and 142c, but the inventive concept is not limited thereto. That is, the blocking layer 140b may include three or more diffusion trap layers. For example, the blocking layer 140b may include four, five, or six or additional diffusion trap layers.

Figure 2C:
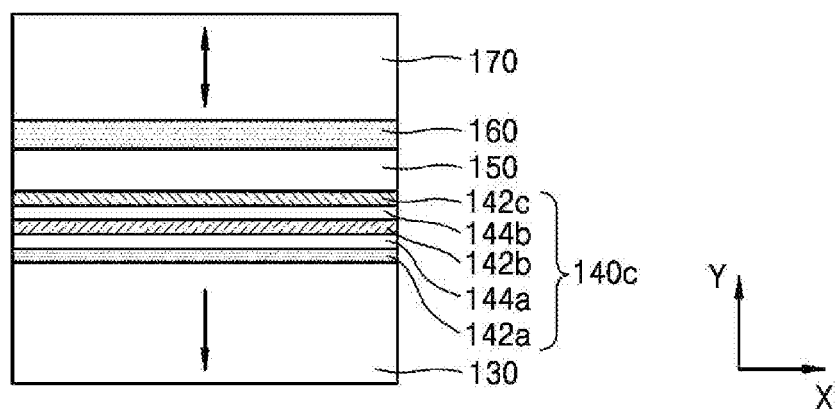

FIG. 2C depicts a cross-sectional view of a magnetic junction 50c that may be included in the MTJ structure 30 of FIG. 1.

For convenience of description, differences between FIGS. 2C and 2A will be described below.

According to exemplary embodiments, a blocking layer 140c may include the first diffusion trap layer 142a, the second diffusion trap layer 142b, and the third diffusion trap layer 142c. The blocking layer 140c may further include a first magnetic interlayer 144a that is disposed between the first diffusion trap layer 142a and the second diffusion trap layer 142b. The blocking layer 140c may further include a second magnetic interlayer 144b that is disposed between the second diffusion trap layer 142b and the third diffusion trap layer 142c.

The first magnetic interlayer 144a and the second magnetic interlayer 144b may have different thicknesses. The first magnetic interlayer 144a and the second magnetic interlayer 144b may have different compositions. The inventive concept, however, is not limited thereto. The first magnetic interlayer 144a and the second magnetic interlayer 144b may have the same thickness, and/or the first magnetic interlayer 144a and the second magnetic interlayer 144b may alternatively have the same composition.

In this regard, the blocking layer 140c may include the three diffusion trap layers 142a, 142b, and 142c and the two magnetic interlayers 144a and 144b, but the inventive concept is not limited thereto. That is, the blocking layer 140c may include three or more diffusion trap layers and two or more magnetic interlayers that are disposed between adjacent diffusion trap layers. For example, the blocking layer 140c may include a plurality of diffusion trap layers and one or more magnetic interlayers that are disposed between the adjacent diffusion trap layers.

Figure 2D:
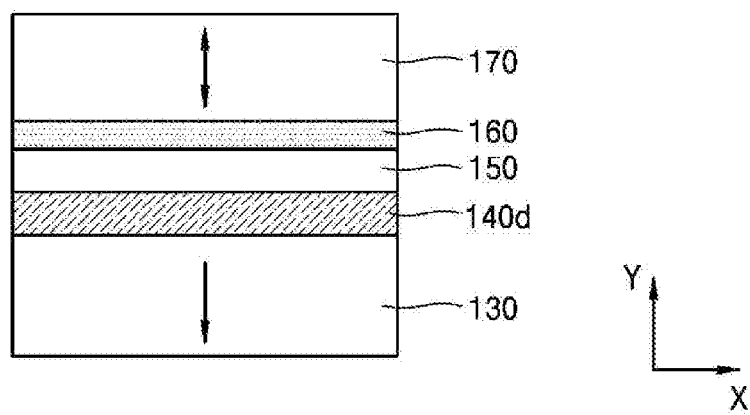

FIG. 2D depicts a cross-sectional view of a magnetic junction 50d that may be included in the MTJ structure 30 of FIG. 1.

For convenience of description, differences between FIGS. 2D and 2A will be described below.

According to exemplary embodiments, a blocking layer 140d may include a transition metal and a magnetic material. As described in connection with FIG. 2A, the transition metal may include Mo, W, Ta, Ti, Zr, Hf, V, and Nb, and the magnetic material may include a material indicated as $Co_aFe_bNi_cB_dZ_{(1-a-b-c-d)}$ in which Z denotes a dopant, a, b, and c denote atom ratios that are respectively $0 \leq a \leq 0.9$, $0 \leq b \leq 0.9$, $0 \leq c \leq 0.9$, and $0.1 \leq d \leq 0.5$, and in which a, b, and c are not simultaneously 0. The dopant Z may include at least one element selected from Si, Cr, Al, Ta, Hf, Zr, Ni, V, Mo, P, C, W, Nb, Mn, and Ge. The magnetic material may be amorphous.

In some embodiments, the blocking layer 140d may include a mixture of the magnetic material and the transition metal. The phrase "mixture of the magnetic material and the transition metal" as used herein means that the magnetic material and the transition metal form a certain crystalline shape or mix in an amorphous structure without forming a crystalline structure. For example, the transition metal may mix with the magnetic material in form of an alloy.

In this regard, a content of the transition metal in the magnetic material and the transition metal may, for example, range from about 10 atom % to about 50 atom %. The content of the transition metal in the magnetic material and the transition metal may, for example, range from about 20 atom % to about 30 atom %, if necessary. If an atom ratio of the transition metal is less than about 10 atom %, a function of preventing some materials included in one layer from diffusing into a peripheral layer, described above, may be insufficient. On the other hand, if the atom ratio of the transition metal is greater than about 50 atom %, a magnetic coupling between the free layer 170, the polarization enhancement layer 150, and the pinned layer 130 may be decoupled or may deteriorate. Atom ratios of the transition metal and the magnetic material are, however, not limited to the above-described ranges. A trapping effect and an effect of supplementing the magnetic junction 50a described in connection with to FIG. 2A may be obtained by appropriately adjusting a ratio of the transition metal and the magnetic material.

The transition metal included in the blocking layer 140d may not be limited to one transition metal and may include two or more transition metals. The blocking layer 140d may include two or more types of different magnetic materials. A thickness of the blocking layer 140d may range from about 3 Å to about 30 Å.

Figure 3:
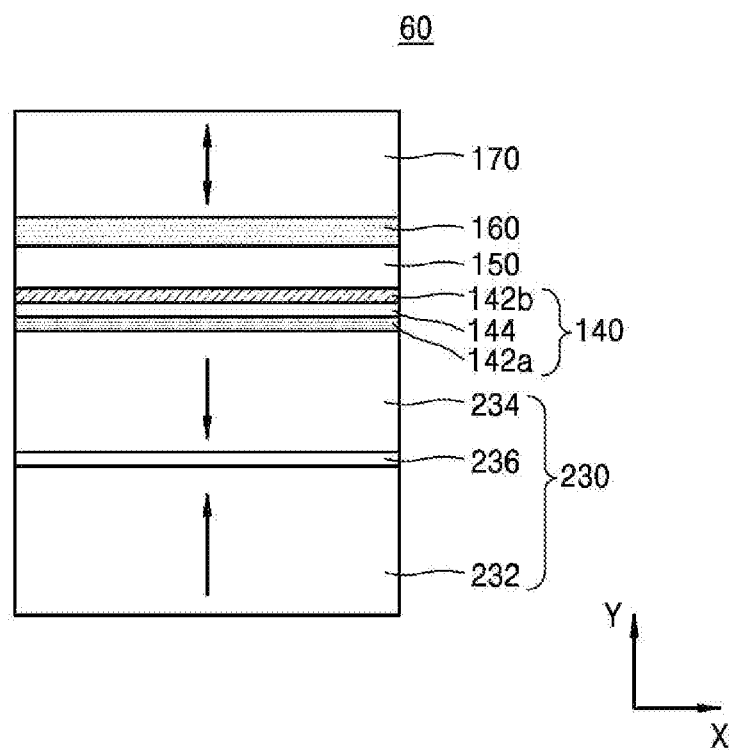
FIG. 3 depicts a cross-sectional view of a magnetic junction that may be included in an MTJ structure according to embodiments of the inventive concept.

FIG. 3 depicts a cross-sectional view of a magnetic junction 60 included in the MTJ structure 30 of FIG. 1.

For convenience of description, differences between FIGS. 3 and 2A will be described below.

According to exemplary embodiments, a pinned layer 230 may have a synthetic anti-ferromagnetic (SAF) structure. The pinned layer 230 may include a first ferromagnetic layer 232, a second ferromagnetic layer 234, and a non-magnetic thin film 236 disposed between the first ferromagnetic layer 232 and the second ferromagnetic layer 234. The SAF structure may exhibit an anti-ferromagnetic coupling (AFC) characteristic due to a Ruderman-Kittel-Kasuya-Yosida (RKKY) interaction. Accordingly, magnetic domains of the first and the second ferromagnetic layers 232 and 234 may be aligned in opposite directions so that the overall magnetization of the SAF structure may be minimized That is, the second ferromagnetic layer 234 may have a magnetic moment that is anti-parallel to the first ferromagnetic layer 232. The first ferromagnetic layer 232 and the second ferromagnetic layer 234 may configure the pinned layer 230 so that magnetization directions of the first ferromagnetic layer 232 and the second ferromagnetic layer 234 do not change.

The first ferromagnetic layer 232 and the second ferromagnetic layer 234 may include CoFeB, CoFe, NiFe, FePt, CoPt, etc. In greater detail, the first ferromagnetic layer 232 and the second ferromagnetic layer 234 may have a similar composition to the pinned layer 130 described in connection with FIG. 2A. The non-magnetic thin film 236 may include a single metal selected from Ru, Cr, Pt, Pd, Ir, Rh, Os, Re, Au, and Cu, or alloys thereof.

Figure 4:
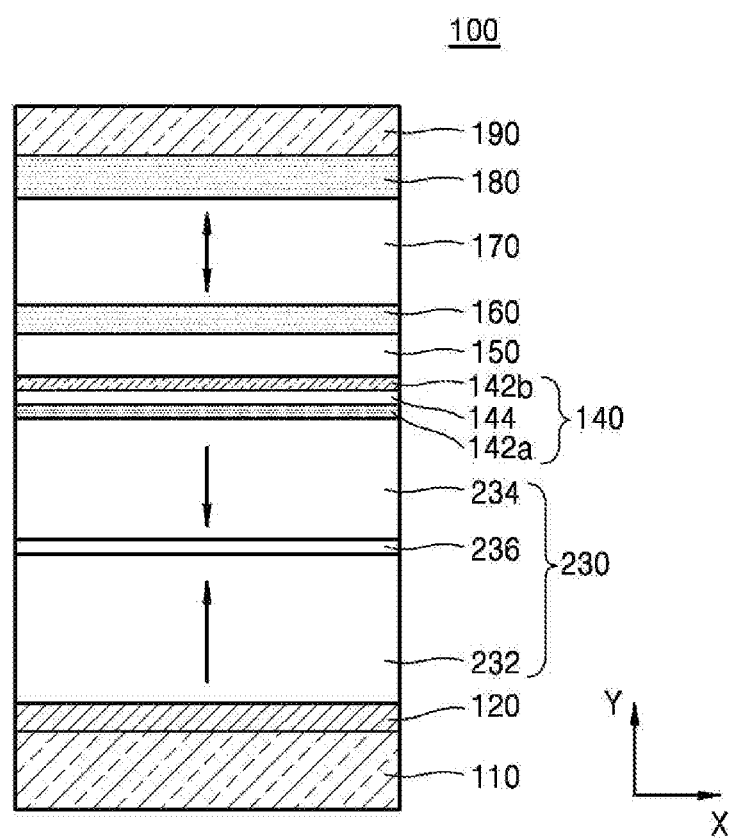
FIG. 4 depicts a cross-sectional view of a magnetic junction that may be included in an MTJ structure device according to embodiments of the inventive concept.

FIG. 4 depicts a schematic cross-sectional view of a magnetic device 100 according to some embodiments of the inventive concept.

For convenience of description, differences between FIGS. 4 and 2A will be described below.

The magnetic device 100 may include an electrode 110, a seed layer 120 formed on the electrode 110, and the pinned layer 230 formed on the seed layer 120.

The electrode 110 may include a metal or a metal nitride. For example, the electrode 110 may include TiN. In some embodiments, the electrode 110 may include a TiN layer having a relatively small content of N in order to implement a low wiring resistance. For example, the electrode 110 may include a TiN layer having an atom ratio of N that is less than an atom ratio of Ti.

The seed layer 120 may include Ru, Pt, or Pd.

In some embodiments, a buffer layer (not shown) may be disposed between the electrode 110 and the seed layer 120. A crystalline structure of the buffer layer may match a crystalline structure of the electrode 110 and a crystalline structure of the seed layer 120 between the electrode 110 and the seed layer 120. For example, the buffer layer may include Ta.

The pinned layer 230 may have the SAF structure described above, and may include the first ferromagnetic layer 232, the second ferromagnetic layer 234, and the non-magnetic thin film 236 that is disposed between the first ferromagnetic layer 232 and the second ferromagnetic layer 234. The first ferromagnetic layer 232 and the second ferromagnetic layer 234 may have a magnetization easy axis in a direction that is perpendicular or substantially perpendicular to a surface of the pinned layer 230 that contacts the seed layer 120. A magnetization direction of the pinned layer 230 may not be changed. In FIG. 4, a magnetization direction of the first ferromagnetic layer 232 may be in a direction that is away from the electrode 110 and toward a free layer 170, and a magnetization direction of the second ferromagnetic layer 234 may be in a direction that is toward the electrode 110 and away from the free layer 170, but the inventive concept is not limited thereto. That is, the magnetization direction of the first ferromagnetic layer 232 may be a direction toward the electrode 110, and the magnetization direction of the second ferromagnetic layer 234 may be in a direction that is away from the electrode 110.

In some embodiments, the first ferromagnetic layer 232 and the second ferromagnetic layer 234 may have the same composition as the pinned layer 130 described in connection with FIG. 2A.

The first ferromagnetic layer 232 and the second ferromagnetic layer 234 may be formed through an ultrathin film epitaxial-growth process, such as a solid-phase epitaxy growth. For example, the first ferromagnetic layer 232 and the second ferromagnetic layer 234 may be formed using a molecular beam epitaxy (MBE) process or a metal organic CVD (MOCVD) process. The first ferromagnetic layer 232 and the second ferromagnetic layer 234 may be formed at a relatively low process temperature that ranges from about 200° C. to about 400° C. For example, the first ferromagnetic layer 232 and the second ferromagnetic layer 234 may be formed at a temperature of about 300° C. The first ferromagnetic layer 232 and the second ferromagnetic layer 234 may have a thickness that ranges from about 20 Å to about 30 Å.

The blocking layer 140 may be formed on the pinned layer 230 to provide a barrier that prevents atoms that are included in the pinned layer 230 from diffusing into the polarization enhancement layer 150. Several exemplary embodiments of the blocking layer 140 are described elsewhere herein.

The polarization enhancement layer 150 may be formed on the pinned layer 230 to increase a spin polarization of the pinned layer 230. The polarization enhancement layer 150 may include a magnetic layer that includes CoFeB. A magnetization direction of the polarization enhancement layer 150 may be the same as the magnetization direction of the first ferromagnetic layer 232 or the second ferromagnetic layer 234. The polarization enhancement layer 150 may have a thickness that ranges from about 10 Å to about 20 Å.

A first tunnel barrier 160 may be formed on the polarization enhancement layer 150. The free layer 170 having a variable magnetization direction may be formed on the first tunnel barrier 160. The free layer 170 may have the same composition as the free layer 170 described in connection with FIG. 2A.

A second tunnel barrier 180 may be formed on the free layer 170.

The first tunnel barrier 160 and the second tunnel barrier 180 may include a non-magnetic material. In some embodiments, each of the first tunnel barrier 160 and the second tunnel barrier 180 may include an oxide of Mg, Ti, Al, MgZn, or MgB. In some other embodiments, each of the first tunnel barrier 160 and the second tunnel barrier 180 may include a Ti oxide or vanadium (V) nitride. In some embodiments, the first tunnel barrier 160 and/or the second tunnel barrier 180 may have a single-layer structure. In other embodiments, the first tunnel barrier 160 and/or the second tunnel barrier 180 may have a multilayer structure that includes a plurality of layers. For example, the first tunnel barrier 160 and/or the second tunnel barrier 180 may have a multilayer structure that is selected from Mg/MgO, MgO/Mg, and/or Mg/MgO/Mg. In some embodiments, the first tunnel barrier 160 may have a thickness that is greater than a thickness of the second tunnel barrier 180.

A capping layer 190 may be formed on the second tunnel barrier 180. The capping layer 190 may include of Ru, Ta, Al, Cu, Au, Ag, Ti, TaN, TiN or a combination thereof.

FIGS. 5A through 5K depict cross-sectional views for sequentially describing a method of manufacturing a magnetic device 500 (see FIG. 5K) according to embodiments of the inventive concept. A process of manufacturing the magnetic device 500 embodied as an STT-MRAM device that includes the MTJ structure 100 of FIG. 4 will now be described in connection with FIGS. 5A through 5K.

Figure 5A:
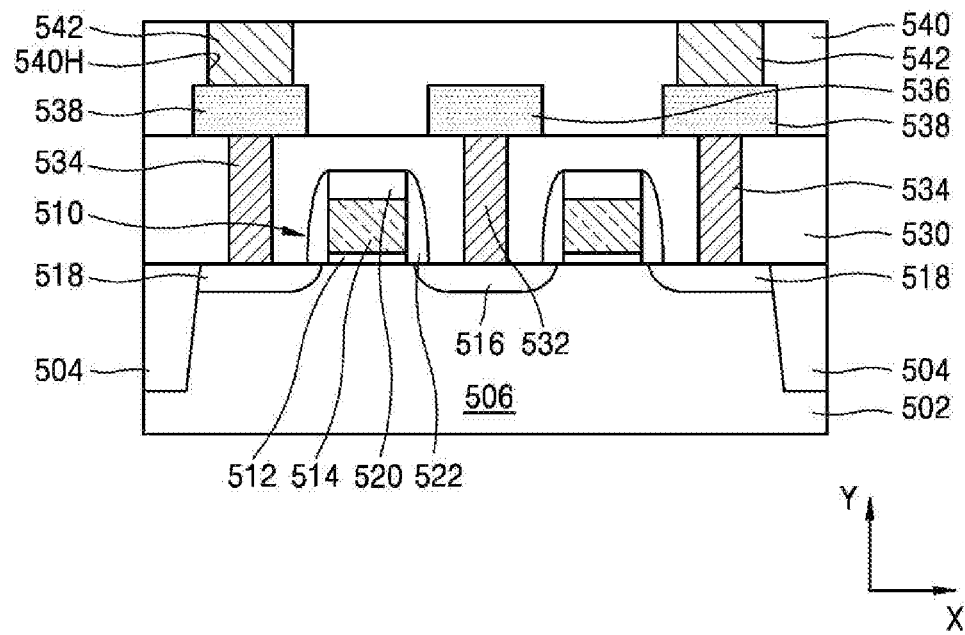
FIGS. 5A through 5K depict cross-sectional views for sequentially describing a method of manufacturing a magnetic device according to embodiments of the inventive concept.

Referring to FIG. 5A, an active region 506 may be defined by forming a device isolation layer 504 on a substrate 502, and a transistor 510 may be formed in the active region 506.

In some embodiments, the substrate 502 may be a semiconductor wafer. The substrate 502 may include silicon (Si). In other embodiments, the substrate 502 may include a semiconductor element, such as germanium (Ge) or a compound semiconductor, such as silicon carbide (SiC), gallium arsenide (GaAs), indium arsenide (InAs), and indium phosphide (InP). In other embodiments, the substrate 502 may have a silicon-on-insulator (SOI) structure. For example, the substrate 502 may include a buried oxide (BOX) layer. In some embodiments, the substrate 502 may include a conductive region, such as a well doped with impurities or a structure doped with impurities. The device isolation layer 504 may have a shallow trench isolation (STI) structure.

The transistor 510 may include a gate insulating layer 512, a gate electrode 514, a source region 516, and drain regions 518. The gate electrode 514 may have an upper surface and side walls that are respectively insulated by an insulating capping pattern 520 and an insulating spacer 522.

Thereafter, a first interlayer insulating layer 530, which is planarized and covers the transistor 510, may be formed on the substrate 502. First contact plugs 532 may be formed that penetrate the first interlayer insulating layer 530 and are electrically connected to the source region 516. Second contact plugs 534 may be formed that penetrate the first interlayer insulating layer 530 and are electrically connected to the drain regions 518. After a conductive layer is formed on the first interlayer insulating layer 530, the conductive layer may be patterned to form a source line 536 that is electrically connected to the source region 516 through the first contact plugs 532 and conductive patterns 538 that are electrically connected to the drain regions 518 through the second contact plugs 534 at both sides of the source line 536.

Thereafter, a second interlayer insulating layer 540 may be formed on the first interlayer insulating layer 530 to cover the source line 536 and the conductive patterns 538. The second interlayer insulating layer 540 may be partially removed through a photolithography process to form a lower electrode contact hole 540H so that upper surfaces of the conductive patterns 538 are exposed. A conductive material may be filled in the lower electrode contact hole 540H and then polished to expose an upper surface of the second interlayer insulating layer 540, and thus lower electrode contact plugs 542 may be formed. In some embodiments, the lower electrode contact plugs 542 may include at least one material selected from TiN, Ti, TaN, Ta, and W.

Figure 5B:
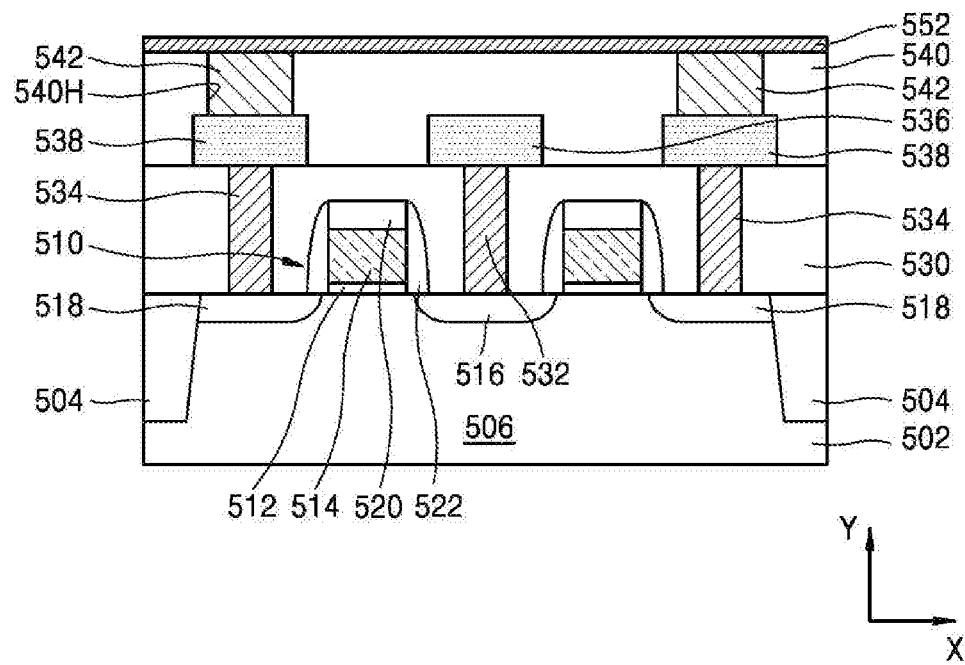

Referring to FIG. 5B, a lower electrode layer 552 may be formed on the second interlayer insulating layer 540 and the lower electrode contact plugs 542.

In some embodiments, the lower electrode layer 552 may include a metal or a metal nitride. For example, the lower electrode layer 552 may include TiN. The lower electrode layer 552 may be formed using a chemical vapor deposition (CVD) process, a physical vapor deposition (PVD) process, an atomic layer deposition (ALD) process, or a reactive pulsed laser deposition (reactive PLD) process. A detailed description of the lower electrode layer 552 is the same as that of the electrode 110 provided in connection with FIG. 4.

Figure 5C:
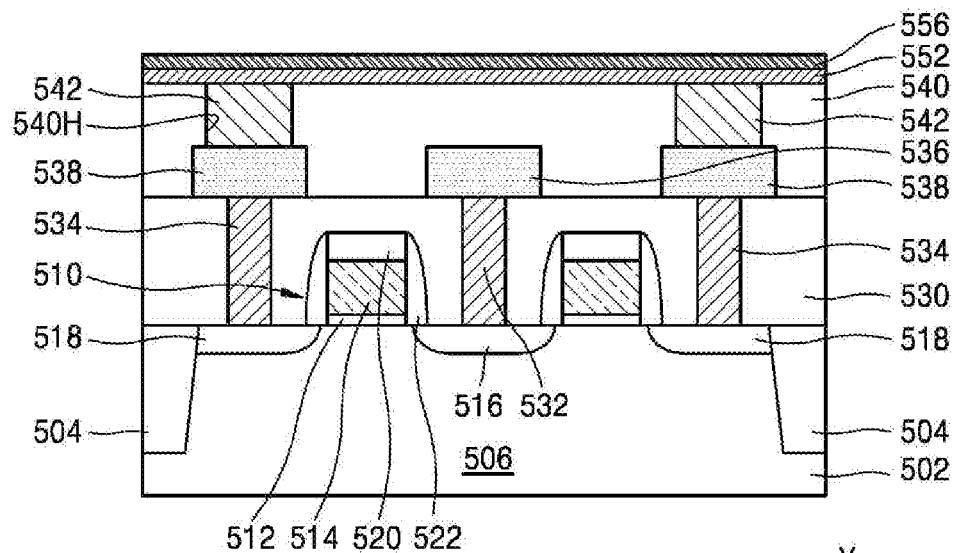
Figure 5C:
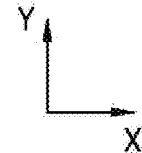

Referring to FIG. 5C, a seed layer 556 may be formed on the lower electrode layer 552.

The seed layer 556 may include a Ru layer, a Pt layer, or a Pd layer. The seed layer 556 may be formed using a CVD process, a PVD process, an ALD process, or a reactive PLD process. In some embodiments, the seed layer 556 may be formed using a DC magnetron sputtering process that uses krypton (Kr) as a sputtering gas.

Figure 5D:
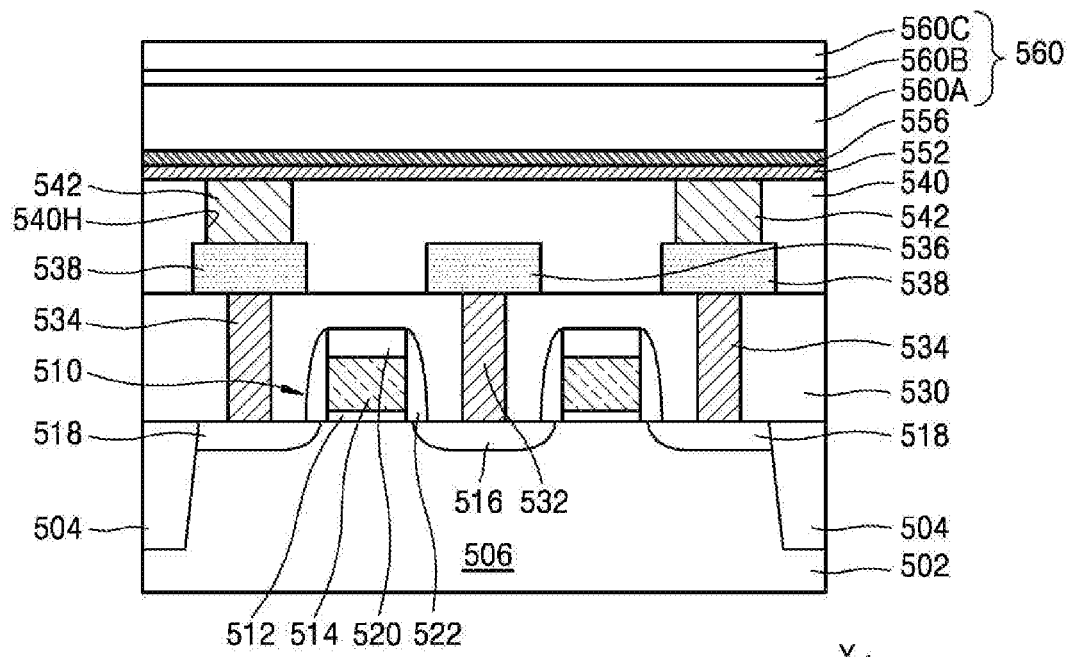
Figure 5D:
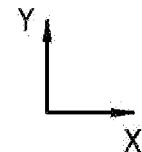

Referring to FIG. 5D, a pinned layer 560 may be formed by sequentially forming a first ferromagnetic layer 560A, a non-magnetic thin film 560B, and a second ferromagnetic layer 560C on the seed layer 556.

A more detailed description of the pinned layer 560 that includes the first ferromagnetic layer 560A, the non-magnetic thin film 560B, and the second ferromagnetic layer 560C is provided in connection with FIG. 3.

The first ferromagnetic layer 560A, the non-magnetic thin film 560B, and the second ferromagnetic layer 560C may be formed using an MBE process or an MOCVD process. The first ferromagnetic layer 560A, the non-magnetic thin film 560B, and the second ferromagnetic layer 560C may be formed at a relatively low process temperature that ranges from about 200° C. to about 400° C.

Figure 5E:
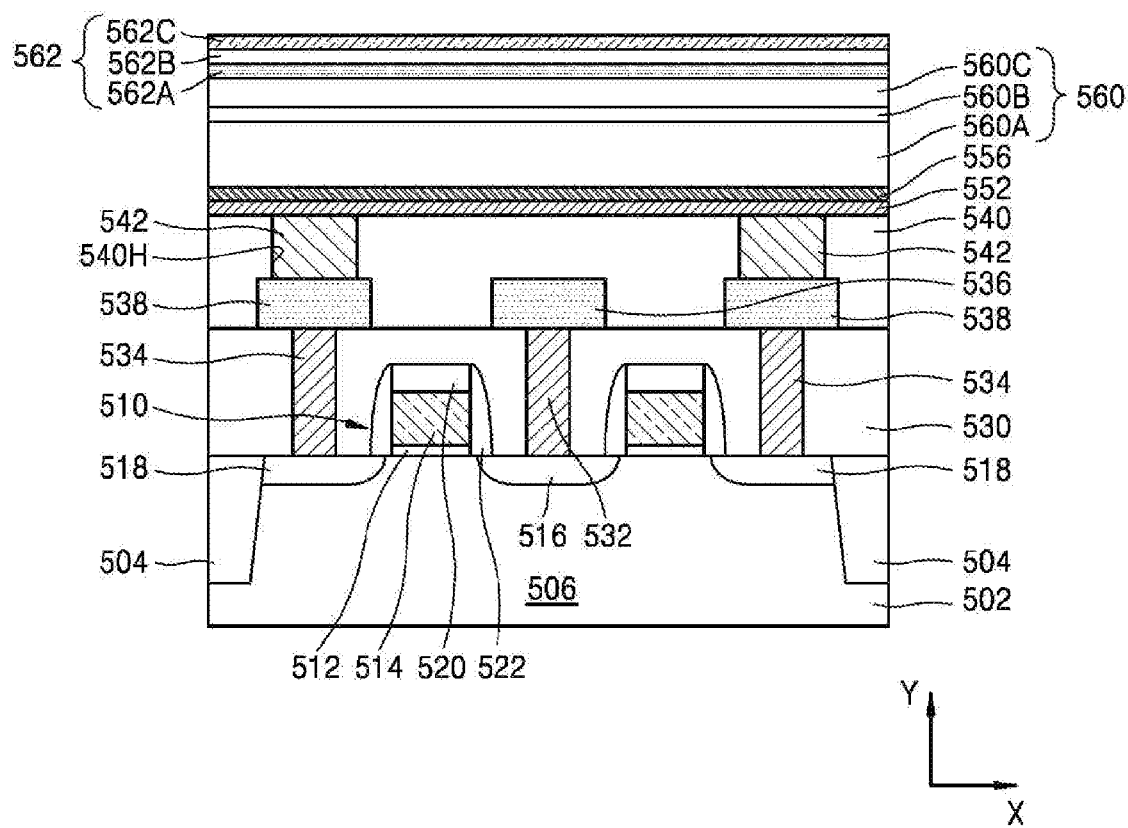

Referring to FIG. 5E, a blocking layer 562 may be formed on the pinned layer 560. The blocking layer 562 may include a first diffusion trap layer 562A, a second diffusion trap layer 562C, and a magnetic interlayer 562B that is disposed between the first diffusion trap layer 562A and the second diffusion trap layer 562C.

The first diffusion trap layer 562A and the second diffusion trap layer 562C may include materials, such as Mo, W, Ta, Ti, Zr, Hf, V, and Nb, alloys thereof, or a combination thereof. In this regard, a thickness of each of the diffusion trap layer 562A and the second diffusion trap layer 562C may be less than about 5 Å. The diffusion trap layer 562A and the second diffusion trap layer 562C may be formed using an ALD process or a sputtering process.

The magnetic interlayer 562B may include a material indicated as $Co_aFe_bNi_cB_dZ_{(1-a-b-c-d)}$ in which Z denotes a dopant, a, b, and c denote atom ratios and are respectively $0 \leq a \leq 0.9$, $0 \leq b \leq 0.9$, $0 \leq c \leq 0.9$, and $0 \leq d \leq 0.5$, and a, b, and c are not simultaneously 0. The dopant Z may include at least one element selected from Si, Cr, Al, Ta, Hf, Zr, Ni, V, Mo, P, C, W, Nb, Mn, and Ge. The magnetic interlayer 562B may have a thickness that ranges from about 3 Å to about 20 Å. The magnetic interlayer 562B may be formed using an ALD process or a sputtering process. Alternatively, the magnetic interlayer 562B may be formed using an MBE process or an MOCVD process.

A more detailed description of the blocking layer 562 that includes the first diffusion trap layer 562A, the second diffusion trap layer 562C, and the magnetic interlayer 562B is generally the same as that of the blocking layer 140a that includes the first diffusion trap layer 142a, the second diffusion trap layer 142b, and the magnetic layer 144 described in connection with FIG. 2A.

Referring again to FIG. 5E, the blocking layer 562 includes the first diffusion trap layer 562A, the second diffusion trap layer 562C, and the magnetic interlayer 562B that is disposed between the first diffusion trap layer 562A the second diffusion trap layer 562C, but the inventive concept is not limited thereto. The blocking layer 562 may have one of the various structures described in connection with FIGS. 2B through 2D.

Figure 5F:
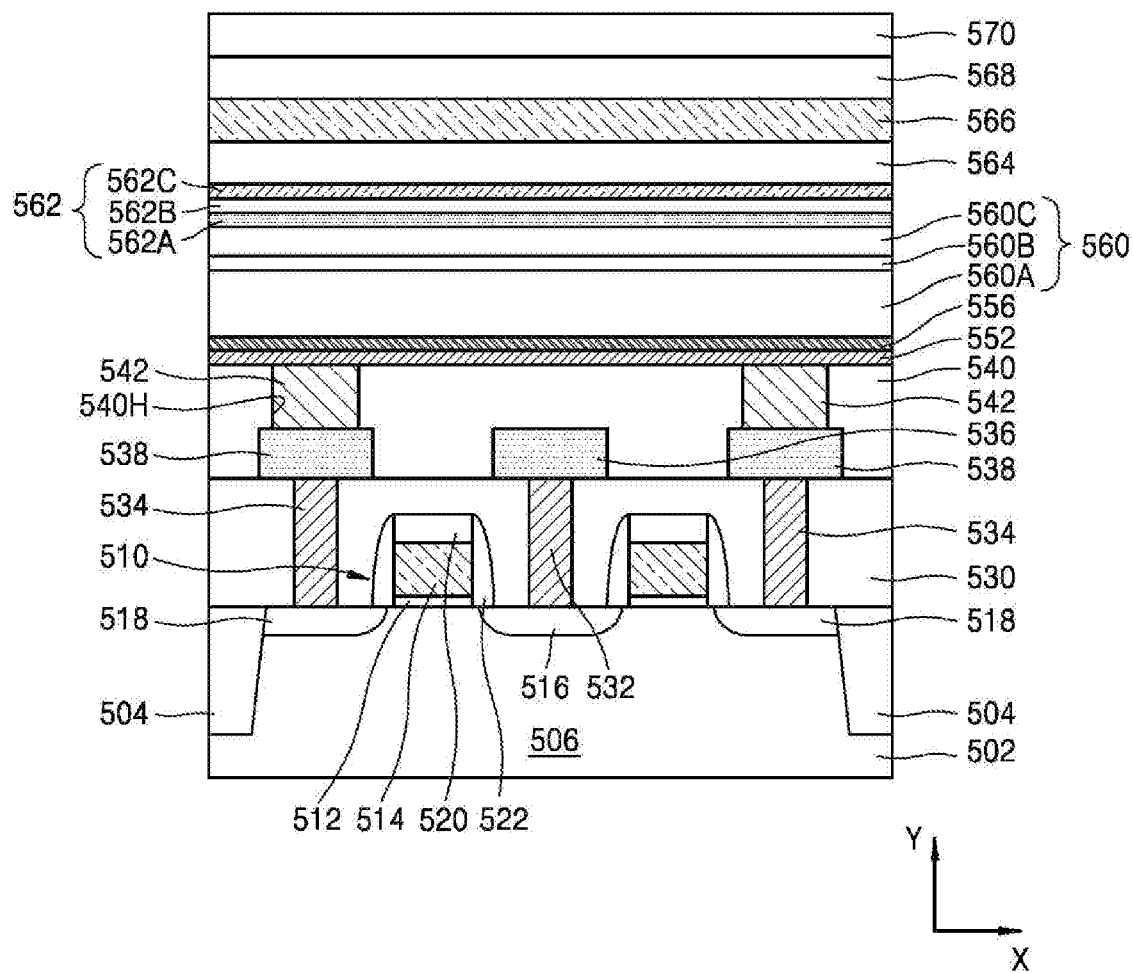

Referring to FIG. 5F, a polarization enhancement layer 564, a first tunnel barrier 566, a free layer 568, and a second tunnel barrier 570 may be sequentially formed on the blocking layer 562.

The polarization enhancement layer 564 may include a CoFeB magnetic interlayer. The polarization enhancement layer 564 may have a thickness that ranges from about 10 Å to about 20 Å. The first tunnel barrier 566 and the second tunnel barrier 570 may be generally the same as the first tunnel barrier 160 and the second tunnel barrier 180 described in connection with FIG. 4. The free layer 568 may be generally the same as the free layer 170 described in connection with FIG. 2A.

Figure 5G:
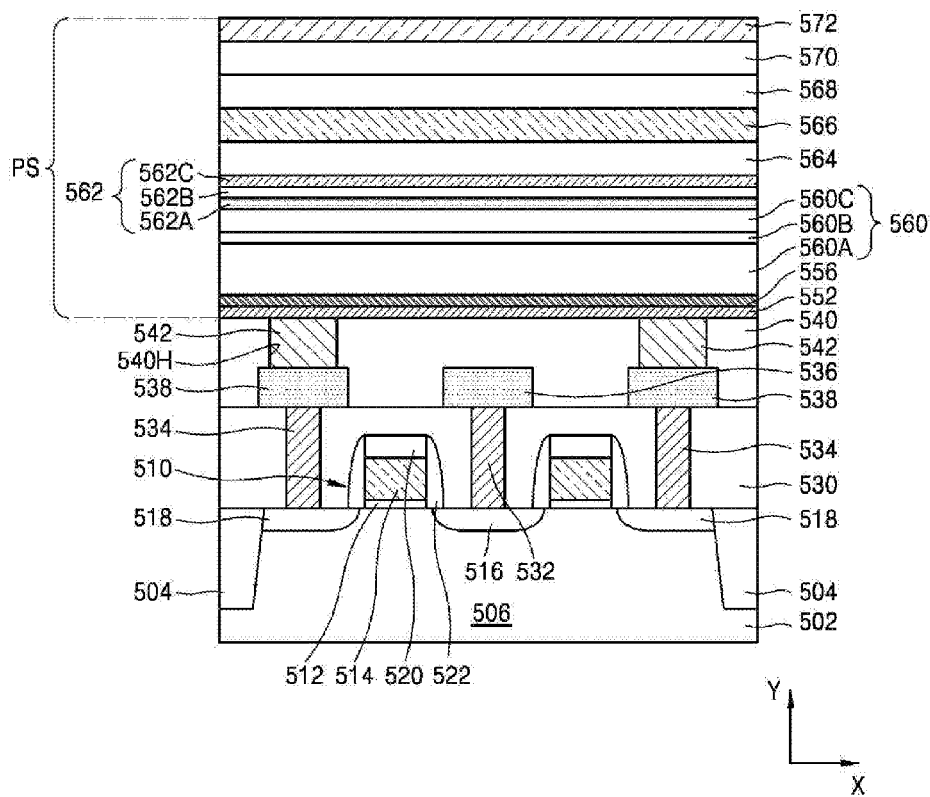

Referring to FIG. 5G, a capping layer 572 may be formed on the second tunnel barrier 570.

The capping layer 572 may include at least one material selected from Ta, Al, Cu, Au, Ti, TaN, and TiN. In some embodiments, the capping layer 572 may be omitted.

A stack structure PS in which layers are sequentially stacked from the lower electrode layer 552 to the capping layer 572 is not limited to that depicted in FIG. 5G and may be modified and changed within the scope of the inventive concept.

Figure 5H:
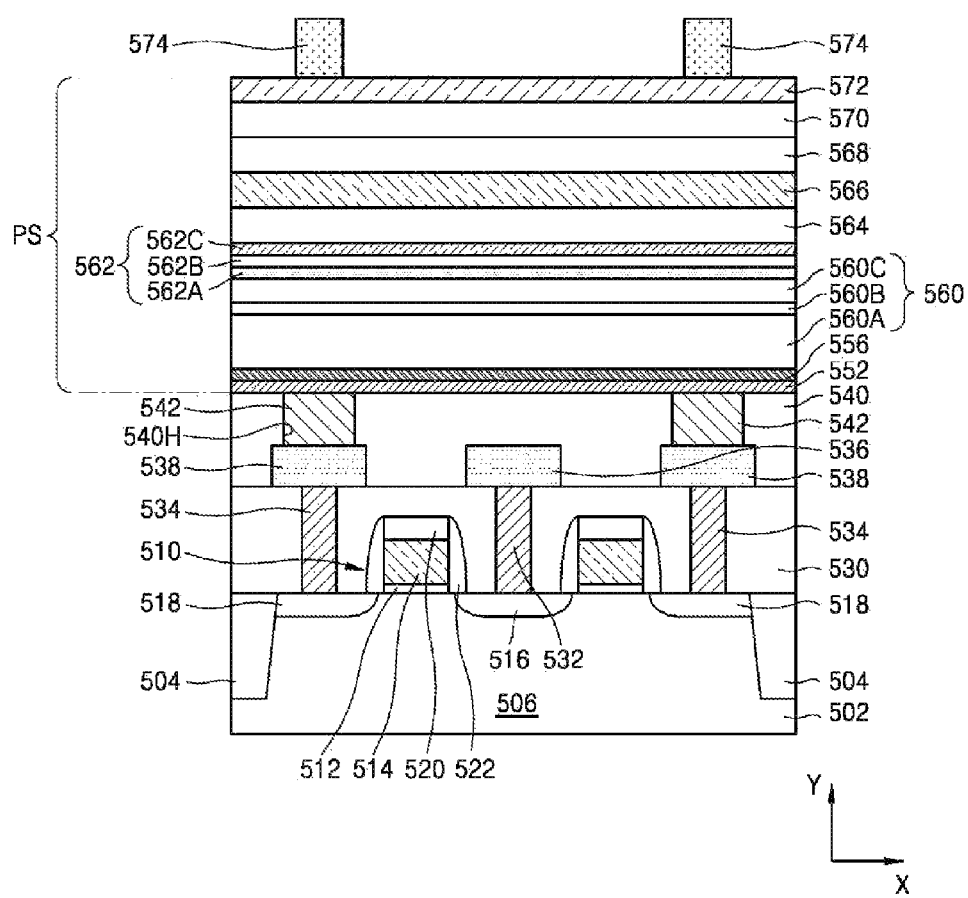

Referring to FIG. 5H, a plurality of conductive mask patterns 574 may be formed on the stack structure PS.

The plurality of conductive mask patterns 574 may include a metal or a metal nitride. In some embodiments, the plurality of conductive mask patterns 574 may include at least one material selected from Ru, W, TiN, TaN, Ti, Ta, and a metallic glass alloy. For example, the plurality of conductive mask patterns 574 may have a double-layer structure that includes Ru/TiN or TiN/W. The plurality of conductive mask patterns 574 may be formed on the same axis as the axis of the lower electrode contact plugs 542.

Figure 5I:
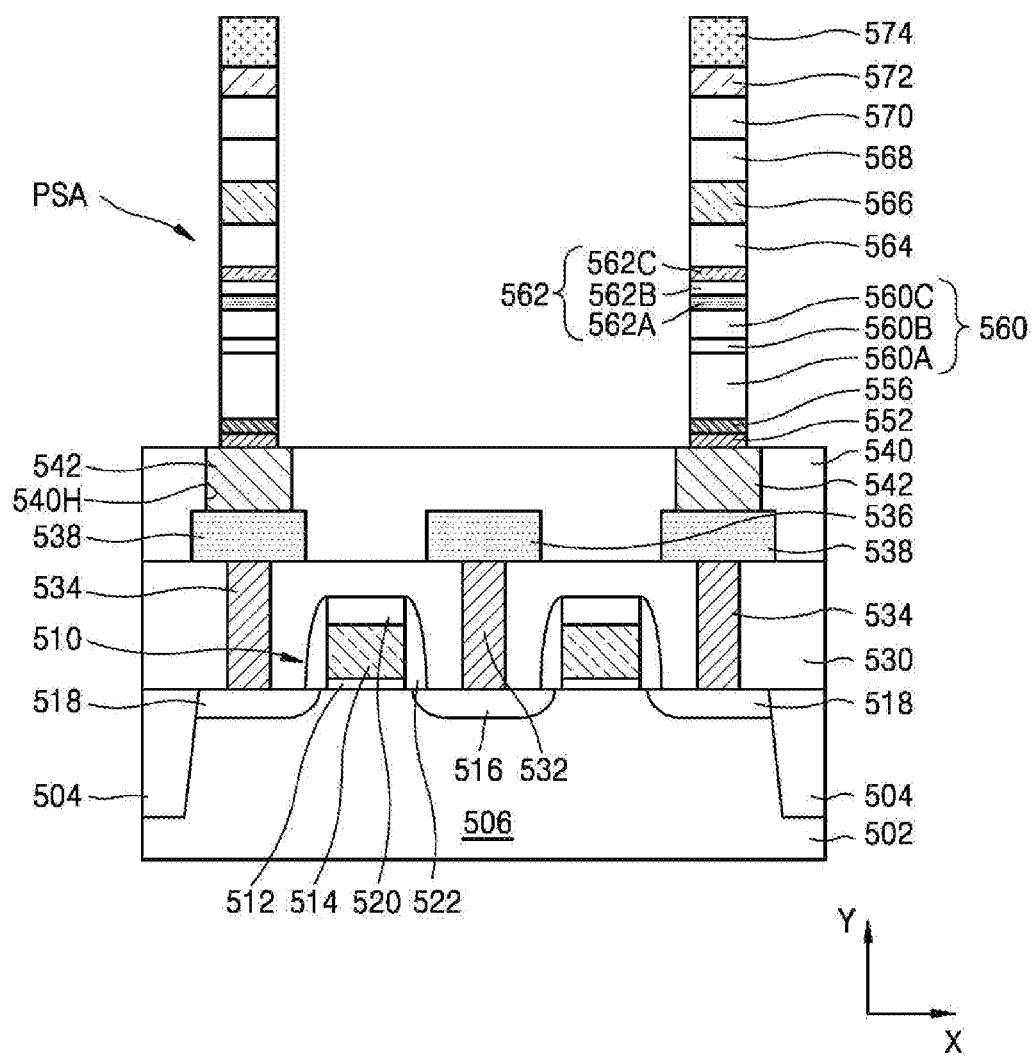

Referring to FIG. 5I, the plurality of conductive mask patterns 574 may be formed into a plurality of magnetoresistance devices PSA by etching the stack structure PS (see FIG. 5H) using the plurality of conductive mask patterns 574 as an etching mask.

In some embodiments, etching the stack structure PS to form the plurality of conductive mask patterns 574 may include loading the stack structure PS into a plasma etching chamber, and then a plasma etching process may be performed. In some embodiments, a reactive ion etching (RIE) process, an ion beam etching (IBE) process, or an Ar milling process may be performed to etch the stack structure PS. In some embodiments, a first etching gas that includes $SF_6$, $NF_3$, $SiF_4$, $CF_4$, $Cl_2$, $CH_3OH$, $CH_4$, CO, $NH_3$, $H_2$, $N_2$, HBr, or a combination thereof, may be used to etch the stack structure PS. In other embodiments, when the stack structure PS is etched, a first additional gas that includes at least one material selected from Ne, Ar, Kr, and Xe may be used in addition to the first etching gas.

The etching of the stack structure PS may be performed by using plasma formed from an inductively coupled plasma (ICP) source, a capacitively coupled plasma (CCP) source, an electron cyclotron resonance (ECR) plasma source, a helicon-wave excited plasma (HWEP) source, or an adaptively coupled plasma (ACP) source.

The etching of the stack structure PS may further include an etching process that uses a second etching gas that has a different composition from the first etching gas. The second etching gas may include $SF_6$, $NF_3$, $SiF_4$, $CF_4$, $Cl_2$, $CH_3OH$, $CH_4$, CO, $NH_3$, $H_2$, $N_2$, HBr, or a combination thereof. In some embodiments, during the etching process that uses the second etching gas, a second additional gas including at least one material selected from Ne, Ar, Kr, and Xe may be further used.

The etching process of the stack structure PS may be performed at a temperature that ranges from about −10° C. to about 65° C., and at a pressure that ranges from about 2 mTorr to about 5 mTorr. During the etching of the stack structure PS, some of upper surfaces of the plurality of conductive mask patterns 574 may be consumed due to the etching atmosphere, and thus the plurality of conductive mask patterns 574 may have a reduced thickness.

Although not depicted, an upper surface of the second interlayer insulating layer 540 that is exposed after the stack structure PS has been etched may be etched by as much as a predetermined amount.

The plurality of magnetoresistance devices PSA may be formed as a resultant of etching the stack structure PS on the lower electrode contact plugs 542. In the plurality of magnetoresistance devices PSA, a remnant of the plurality of conductive mask patterns 574 and the capping layer 572 may function as upper electrodes.

Figure 5J:
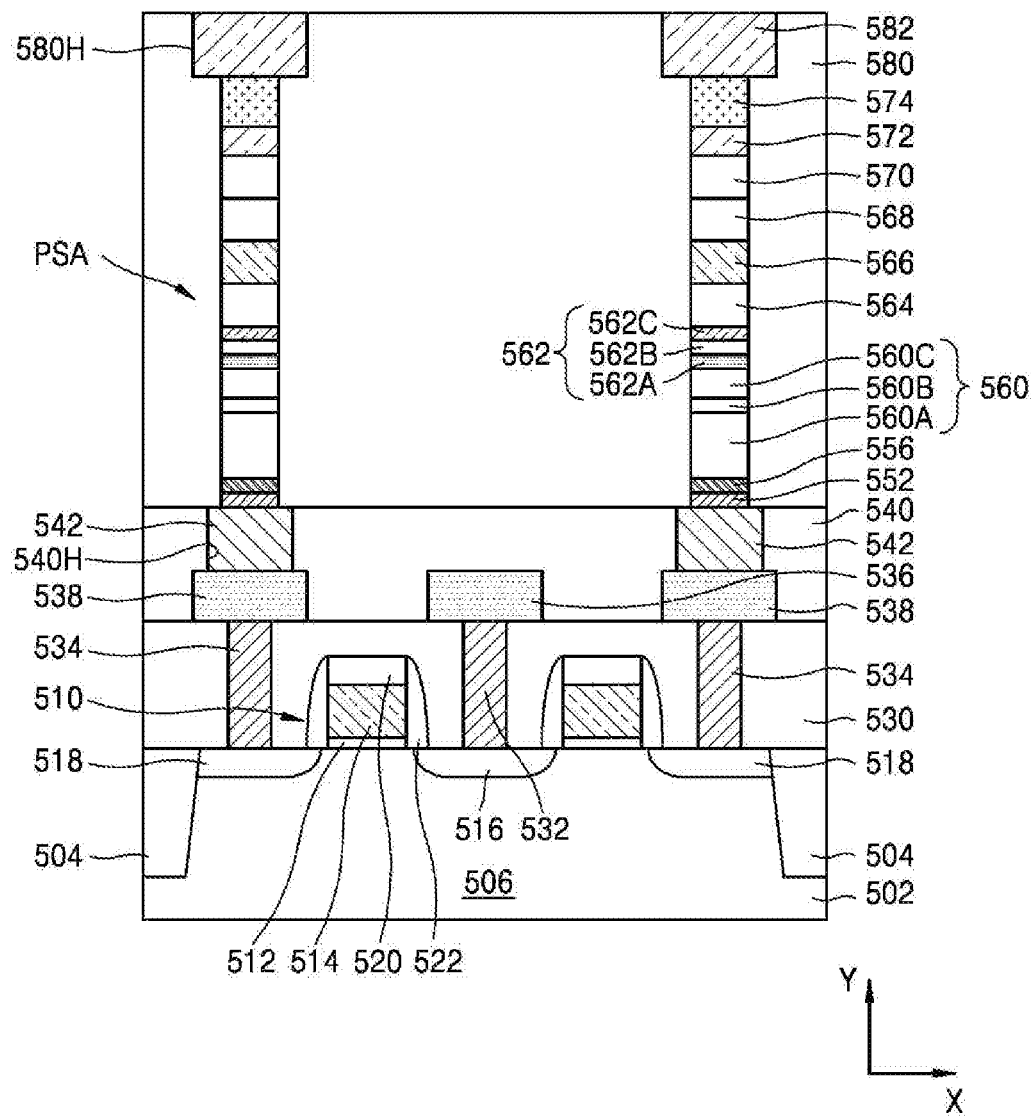

Referring to FIG. 5J, a third interlayer insulating layer 580 may be formed that covers the plurality of magnetoresistance devices PSA and is then planarized. A plurality of bit line contact holes 580H may be formed by removing a partial region of the third interlayer insulating layer 580 using etching so that upper surfaces of the plurality of conductive mask patterns 574 that form the plurality of magnetoresistance devices PSA are exposed. Thereafter, conductive layers that fill insides of the plurality of bit line contact holes 580H may be formed and then polished or etched-back until an upper surface of the third interlayer insulating layer 580 is exposed. Thus, a plurality of bit line contact plugs 582 may be formed in the plurality of bit line contact holes 580H.

Figure 5K:
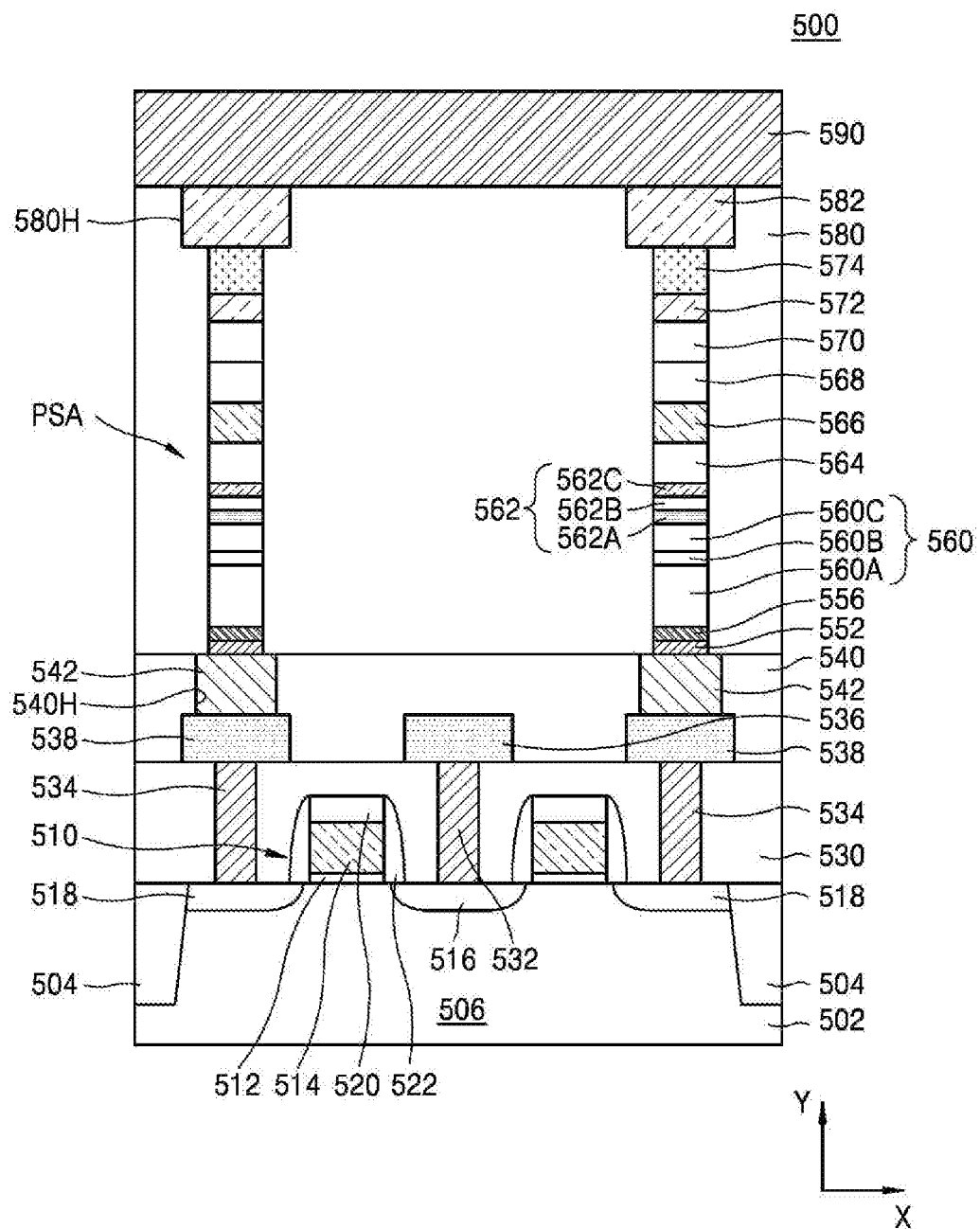

Referring to FIG. 5K, a conductive layer for forming a bit line 590 may be formed on the third interlayer insulating layer 580. The plurality of bit line contact plugs 582 may be formed and patterned, and thus the magnetic device 500 may be completed by forming a bit line 590 in a line shape that is electrically connected to the plurality of bit line contact plugs 582.

While the inventive concept has been particularly shown and described with reference to embodiments thereof, it will be understood that various changes in form and details may be made therein without departing from the scope of the following claims.

What is claimed is:

1. A magnetic device, comprising:
   a free layer;
   a pinned layer;
   a tunnel barrier disposed between the free layer and the pinned layer;
   a polarization enhancement layer disposed between the tunnel barrier and the pinned layer; and
   a blocking layer disposed between the polarization enhancement layer and the pinned layer,
   wherein the blocking layer includes a first diffusion trap layer and a second diffusion trap layer disposed on the first diffusion trap layer.

2. The magnetic device of claim 1, wherein at least one of the first diffusion trap layer and the second diffusion trap layer comprises at least one of Mo, W, Ta, Ti, Zr, Hf, V, or Nb, or an alloy thereof.

3. The magnetic device of claim 1, wherein each of the first diffusion trap layer and the second diffusion trap layer has a thickness that is less than about 5 Å.

4. The magnetic device of claim 1, wherein the pinned layer includes a synthetic antiferromagnetic coupling (SAF) structure.

5. The magnetic device of claim 1,
   wherein the pinned layer has a structure oriented along a (0001) crystalline surface of a hexagonal closest packing (HCP) structure or a (111) crystalline surface of a face-centered cubic structure, and
   wherein the free layer has a structure oriented along a (001) crystalline surface of a body-centered cubic (BCC) structure.

6. The magnetic device of claim 1, wherein a composition of the first diffusion trap layer and a composition of the second diffusion trap layer are different from each other.

7. The magnetic device of claim 1, wherein a thickness of the first diffusion trap layer and a thickness of the second diffusion trap layer are different from each other.

8. The magnetic device of claim 1, further comprising: a magnetic interlayer disposed between the first diffusion trap layer and the second diffusion trap layer.

9. The magnetic device of claim 8, wherein the magnetic interlayer is amorphous.

10. The magnetic device of claim 8, wherein the magnetic interlayer comprises a material indicated as $Co_aFe_bNi_cB_dZ_{(1-a-b-c-d)}$ in which Z denotes a dopant, a, b, and c denote atom ratios that are respectively 0≤a≤0.9, 0≤b≤0.9, 0≤c≤0.9, and 0≤d≤0.5, and a, b, and c are not simultaneously 0, and
wherein the dopant Z comprises at least one element selected from Si, Cr, Al, Ta, Hf, Zr, Ni, V, Mo, P, C, W, Nb, Mn, and Ge.

11. The magnetic device of claim 8, wherein a thickness of the magnetic interlayer ranges from about 3 Å to about 20 Å.

12. A magnetic device, comprising:
a free layer;
a pinned layer;
a tunnel barrier disposed between the free layer and the pinned layer;
a polarization enhancement layer disposed between the tunnel barrier and the pinned layer; and
a blocking layer disposed between the polarization enhancement layer and the pinned layer,
wherein the blocking layer includes a mixture of a transition metal and a magnetic material.

13. The magnetic device of claim 12, wherein the transition metal and the magnetic material of the blocking layer form of an alloy.

14. The magnetic device of claim 12, wherein a thickness of the blocking layer ranges from about 3 Å to about 30 Å.

15. The magnetic device of claim 12, wherein a content of the transition metal ranges from about 10 atom % to about 50 atom %.

16. A magnetic memory device, comprising:
a pinned magnetic layer having a first surface and a second surface;
a blocking layer on the first surface of the pinned magnetic layer, the blocking layer comprising a first diffusion trap layer and a second diffusion trap layer disposed on the first diffusion trap layer;
a polarization enhancement layer on the blocking layer; and
a tunnel barrier layer on the polarization enhancement layer.

17. The magnetic memory device of claim 16, wherein each of the first diffusion trap layer and the second diffusion trap layer has a thickness that is less than about 5 Å.

18. The magnetic memory device of claim 16, wherein a composition of the first diffusion trap layer and a composition of the second diffusion trap layer are different from each other.

19. The magnetic memory device of claim 16, further comprising: a magnetic interlayer disposed between the first diffusion trap layer and the second diffusion trap layer.

20. The magnetic memory device of claim 19, wherein the magnetic interlayer is amorphous.

* * * * *